(12) United States Patent
Sai et al.

(10) Patent No.: US 7,207,720 B2
(45) Date of Patent: Apr. 24, 2007

(54) STATIC GAS BEARING SYSTEM, STAGE MECHANISM, EXPOSURE APPARATUS, AND DEVICE MANUFACTURING METHOD

(75) Inventors: Choshoku Sai, Utsunomiya (JP); Kotaro Akutsu, Soka (JP)

(73) Assignee: Canon Kabushiki Kaisha, Tokyo (JP)

( * ) Notice: Subject to any disclaimer, the term of this patent is extended or adjusted under 35 U.S.C. 154(b) by 89 days.

(21) Appl. No.: 10/991,526

(22) Filed: Nov. 19, 2004

(65) Prior Publication Data

US 2005/0129339 A1 Jun. 16, 2005

(30) Foreign Application Priority Data

Nov. 20, 2003 (JP) .............................. 2003-390444

(51) Int. Cl.
*F16C 32/06* (2006.01)
(52) U.S. Cl. ........................... 384/12; 384/15; 384/100
(58) Field of Classification Search .................. 384/12, 384/15, 100
See application file for complete search history.

(56) References Cited

U.S. PATENT DOCUMENTS

| | | | | |
|---|---|---|---|---|
| 4,726,689 | A | * 2/1988 | Pollock ........................ | 384/12 |
| 4,749,283 | A | * 6/1988 | Yokomatsu et al. .......... | 384/12 |
| 5,218,896 | A | * 6/1993 | Furukawa ..................... | 384/12 |
| 5,382,095 | A | 1/1995 | Akutsu ........................ | 384/100 |
| 5,701,041 | A | 12/1997 | Akutsu et al. ................ | 310/12 |
| 5,717,482 | A | 2/1998 | Akutsu et al. ................ | 355/53 |
| 5,726,548 | A | 3/1998 | Chiba et al. ................. | 318/625 |
| 5,858,587 | A | 1/1999 | Yamane et al. ............... | 430/22 |
| 5,864,389 | A | 1/1999 | Osanai et al. ................ | 355/53 |
| 6,028,376 | A | 2/2000 | Osanai et al. ................ | 310/12 |
| 6,324,933 | B1 | * 12/2001 | Waskiewicz et al. ..... | 74/490.01 |
| 2002/0118897 | A1 | * 8/2002 | Sakino et al. ................ | 384/12 |
| 2002/0176061 | A1 | 11/2002 | Sai ............................. | 355/53 |
| 2005/0008269 | A1 | 1/2005 | Akutsu et al. ................ | 384/12 |
| 2005/0018165 | A1 | 1/2005 | Akutsu ........................ | 355/72 |

FOREIGN PATENT DOCUMENTS

JP      2001-7180    1/2001

* cited by examiner

*Primary Examiner*—Thomas R. Hannon
(74) *Attorney, Agent, or Firm*—Fitzpatrick, Cella, Harper & Scinto

(57) ABSTRACT

An apparatus includes a static gas bearing provided upon a first object and configured to form a gas layer between the first object and a second object by use of gas supplied thereto, and to support the first object movably relative to the second object, a plurality of exhaust grooves provided upon the first object and configured to surround the static gas bearing, and a plurality of exhaust flowpassages provided through the first object, connecting to a respective one of the plurality of exhaust grooves, and configured to exhaust gas from a respective one of the plurality of exhaust grooves. An outermost exhaust flowpassage of the plurality of exhaust flowpassages connected to an outermost exhaust groove, which is outermost of one of the plurality of exhaust grooves with respect to the static gas bearing, is shorter than an innermost exhaust flowpassage of the plurality of exhaust flowpassages connected to an innermost exhaust groove, which is innermost one of the plurality of exhaust grooves with respect to the static gas bearing, so that a conductance of the outermost exhaust flowpassage is greater than that of the innermost exhaust flowpassage.

6 Claims, 7 Drawing Sheets

STATIC GAS BEARING SYSTEM, STAGE MECHANISM, EXPOSURE APPARATUS, AND DEVICE MANUFACTURING METHOD

FIELD OF THE INVENTION AND RELATED ART

This invention relates generally to a stage system usable in various measuring machines operated in a vacuum ambience or in projection exposure apparatuses used in a semiconductor lithographic process, for example, for moving and positioning a substrate, such as a wafer or a reticle, quickly and precisely. In another aspect, the invention concerns a static gas bearing system applicable to such a stage system.

FIG. 5 illustrates a known example of a stage system to be used in a vacuum, and this is a slider system for use in a vacuum ambience, using an air pad, such as disclosed in Japanese Laid-Open Patent Application, Publication No. 2001-7180. The stage system illustrated in the drawing includes a flat base 101 having a central bore, and a moving member 102, which comprises flat plates disposed adjacent to the top and bottom faces of the flat plate 101, respectively, and which are connected to each other through the central bore of the flat base 101. The stage system further includes a pad 103 provided at the peripheral edge portion of the central bore of the flat base 101, and three-stage suction grooves 106a, 107a and 108a provided to surround the air pad, for sucking the air discharged from the air pad. The moving member 102 is made movable while being caused to float from the flat base 101 by means of the air pad. Almost all the air discharged from the air pad is collected by means of a vacuum pump, which is connected to exhaust ports 106b, 107b, 108b, having the same diameter and connected to the suction grooves 106a, 107a and 108a, respectively.

In next-generation semiconductor exposure apparatuses, for example, moving and positioning stage systems, such as described above, would be required to be placed in a high vacuum ambience. As an example, in an electron beam exposure apparatus, a level of $1.0 \times 10^{-4}$ Pa would be necessary. On the other hand, in most exposure apparatuses currently used, as a guiding bearing system, a static gas bearing having high motion precision and being clean and maintenance-free is used. When such a static gas bearing is used in a stage system placed in a vacuum, in order to assure a desired vacuum level, it is necessary to collect the gas exhausted form the static gas bearing. Also, in order to reduce the amount of gas leaking from the static gas bearing to the surrounding space, exhausting grooves are provided in plural stages around the static gas bearing, and these grooves are connected to a vacuum pump through exhaust flowpassages, respectively, thereby to collect the exhausted gas from the static gas bearing. For example, in the structure of FIG. 5, three stages of exhaust grooves are provided. In order to improve the exhausting efficiency, the exhaust flowpassages connected to the exhaust grooves should have a large conductance. To this end, the length of each exhaust flowpassage should be made as short as possible and the sectional area thereof should be made as wide as possible. However, due to structural restriction, shortening the length of the exhaust flowpassage has a limit. Further, since the conductance is inversely proportional to the length, if the length of the exhaust flowpassage is fixed, it would be more practical and effective to enlarge the sectional area of the exhaust flowpassage.

If, however, the sectional area of the exhaust flowpassage is made too wide, not only does it lead to over-specification, but also, it causes an increase in the cost and of the whole size of the stage system. Furthermore, if the exhaust ports have the same diameter as described above, there is a possibility of an error that these exhaust ports are connected to the wrong pumps during the assembly.

SUMMARY OF THE INVENTION

It is accordingly an object of the present invention to provide a static gas bearing assembly and/or a stage system using the same, by which at least one of the problems described above, can be solved or reduced.

Briefly, in accordance with an aspect of the present invention, there is provided a static gas bearing, comprising a static gas bearing portion for forming a gas layer between a first object and a second object by use of a gas supplied thereto, and for supporting the second object to be movable relative to the first object, a plurality of exhaust grooves of a number n, wherein n is an integer larger than 1, being provided to surround the static gas bearing portion upon the first object and/or the second object, and a plurality of exhaust flowpassages of a number n, provided inside the first object and/or the second object, for exhausting a gas, supplied to the static gas bearing portion, outwardly of the first or second object through the plurality of exhaust grooves, wherein a conductance of an n-th exhaust flowpassage of the plurality of exhaust flowpassages, being connected to an n-th exhaust groove, which is an outermost one of the plurality of exhaust grooves, is made greater than a conductance of a first exhaust flowpassage of the plurality of exhaust flowpassages, being connected to a first exhaust groove, which is an innermost one of the plurality of exhaust grooves, and wherein an area of an exhaust port from the n-th exhaust flowpassage, opening to the outside, is made greater than that of an exhaust port of the first exhaust flowpassage.

In accordance with another aspect of the present invention, there is provided, in a stage system to be disposed inside a vacuum chamber, a static gas bearing provided between a movable member and a fixed member, the static gas bearing including a plurality of exhaust grooves provided in plural stages around a static gas bearing surface of the static gas bearing, for collecting a gas discharged from the static gas bearing, the plurality of exhaust grooves having associated exhaust flowpassages, which are independent of each other, wherein the plurality of exhaust flowpassages are provided inside and outside the movable member and/or the fixed member and they are connected to a vacuum pump, disposed outside the vacuum chamber, through a wall of the vacuum chamber, wherein a conductance is caused of one exhaust flowpassage of the plurality of exhaust flowpassages, being connected to one of the plurality of exhaust grooves, which one is most remote from the static gas bearing surface, and a sectional area of a portion that connects the inside and outside of the movable member and/or one exhaust flowpassage being connected to one of the plurality of exhaust grooves, which one is closest to the static gas bearing surface.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

A vacuum stage system according to one preferred form of the present invention includes a gas bearing for supporting a structure without contact thereto, and a plurality of exhaust grooves disposed in plural stages to surround the gas bearing, the exhaust groove having associated exhaust flowpassages, which are independent of each other, and the exhaust flowpassages being connected to a vacuum pump outside a vacuum chamber in which a vacuum stage is accommodated, through a wall of the vacuum chamber by feedthrough. When the exhaust grooves are numbered as first-stage, second-stage, third-stage . . . and n-th stage, in an order from one exhaust groove closest to the gas bearing, the conductance of at least the exhaust flowpassage associated with the n-th stage exhaust groove, which is an outermost one, is made greater than the conductance of the exhaust flowpassage associated with the first-stage exhaust groove, closest to the static gas bearing. Furthermore, as regards the sectional area of a portion of the exhaust flowpassage, connecting from the inside to the outside of the vacuum stage, the sectional area of the exhaust flowpassage of the n-th stage exhaust groove is made greater than that of the exhaust flowpassage of the first-stage exhaust groove.

For enlargement of the conductance, the length of the exhaust flowpassage may be made as short as possible or the sectional area of the exhaust flowpassage may be made as large as possible.

For example, if the exhaust grooves are provided in a three-stage structure, taking into account the actual flow of gas through the exhaust flowpassages, the first stage could be a viscous flow, the second stage could be a molecular flow, and the third stage could be an intermediate flow, intermediate between the viscous flow and the molecular flow. Thus, from the standpoint of flow resistance, if the exhaust flowpassages have the same diameter, the exhausting efficiency could be improved by making larger the sectional areas of the exhaust flowpassages in an order of the first stage, second stage and third stage, thereby to make smaller the conductance of the flowpassages of the first stage, second stage and third stage, in this order. This is advantageous also in the point of easiness of production and cost of projection.

In accordance with this form of the present invention, air which leaks from the static gas bearing into the vacuum chamber can be collected at high efficiency. Additionally, the assembling operation is simple, and the possibility of an assembling error of a wrong connection, or the like, can be reduced significantly. Preferred embodiments of the present invention will be described specifically below, in conjunction with the drawings.

First Embodiment

Figure 1:
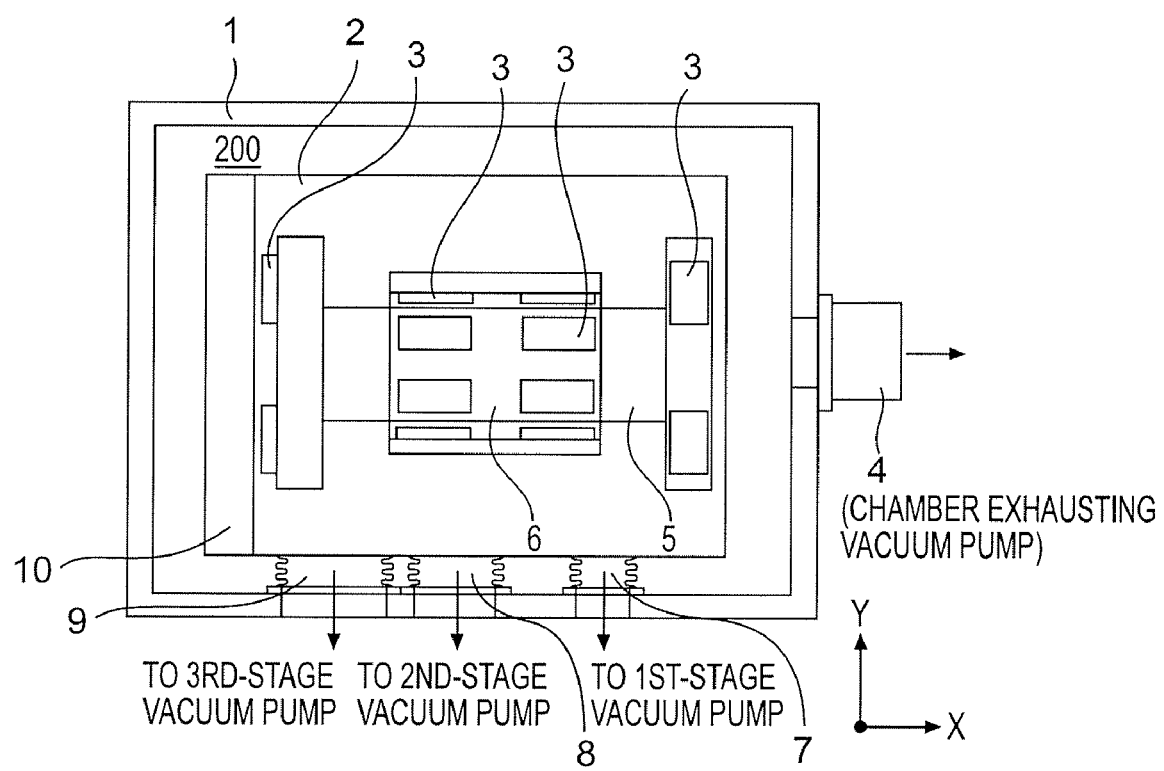
FIG. 1 is a schematic view of a general structure of a vacuum stage system according to an embodiment of the present invention.
Figure 3:
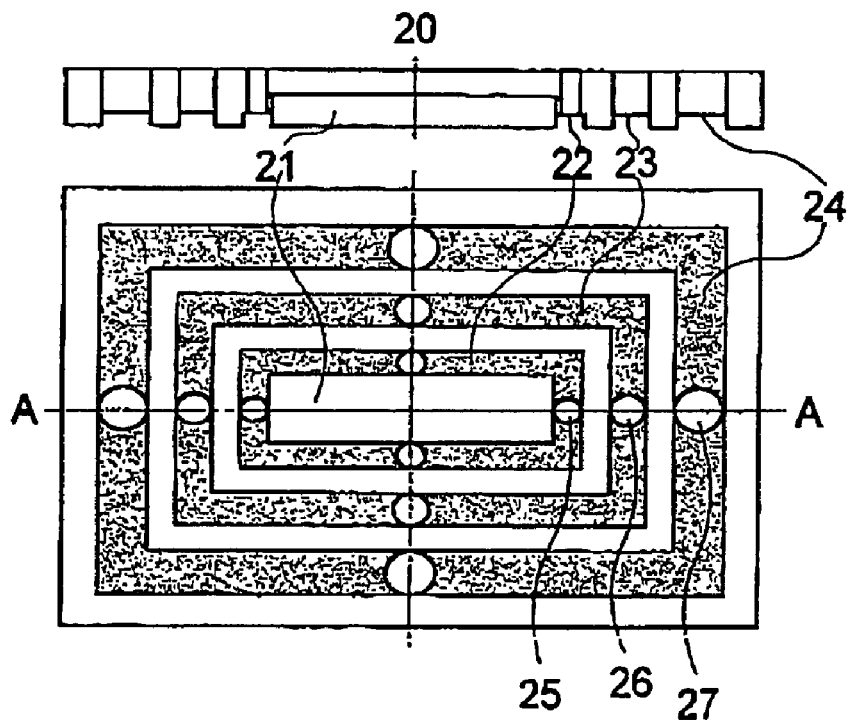
FIG. 3 is a schematic view of an example of a vacuum static gas bearing system, which is usable in the structure of FIG. 1.

FIG. 1 illustrates the structure of a vacuum stage system according to a first embodiment of the present invention. As illustrated, the vacuum stage system is shown as a positioning system 200, which is placed inside a vacuum chamber 1. In the positioning system 200, a first movable object 5 and a second movable object 6 are movable upon a stage base 2 in X and Y directions in FIG. 1, while being guided by a static gas bearing 3. Compressed air discharged from the static gas bearing 3 enters the stage base 2 (fixed member), from a static gas bearing surface 21 having a structure as illustrated in FIG. 3, or from a surface opposed thereto, and through a first movable guide 10 and the movable members 4 and 6 of the stage system of FIG. 1. Then, the gas flows through a first-stage exhaust pipe 7, a second-stage exhaust pipe 8 and a third-stage exhaust pipe 9, in an order from the stage base 2, and through a bore (feed-through) formed in the wall of the vacuum chamber 1, and the gas is collected by a vacuum pump (not shown) provided outside the vacuum chamber 1.

Figure 2A:
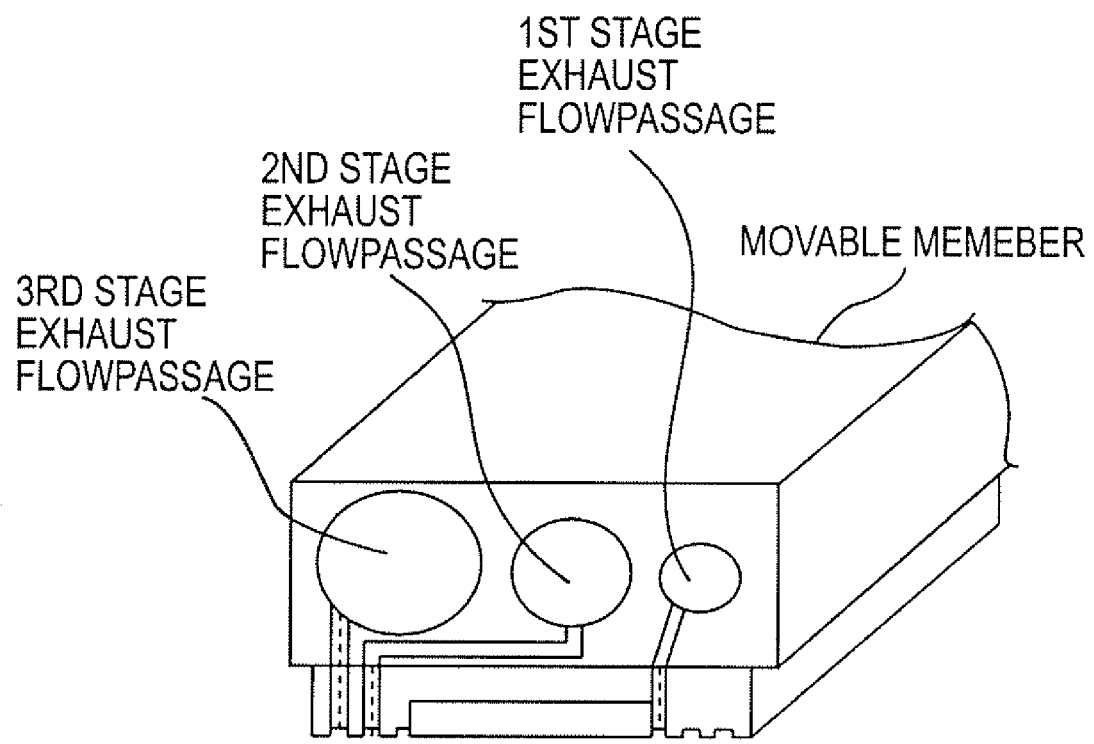
FIGS. 2A and 2B are schematic views, respectively, for explaining an example of exhaust flowpassages extending through a movable member, in the structure of FIG. 1.
Figure 2B:
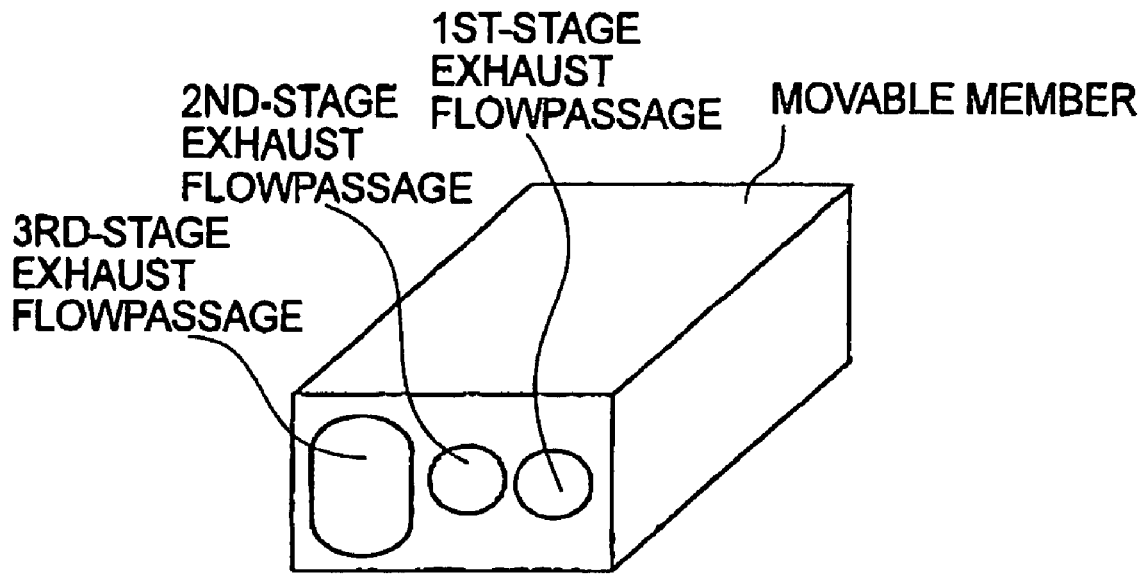

It should be noted here that, as shown in FIG. 2B, the sectional area of at least the exhaust flowpassage connected to one of the exhaust grooves, which one is most remote from the static gas bearing surface, is made greater than the sectional area of the exhaust flowpassage connected to the first-stage exhaust groove, which is closest to the static gas bearing surface. On that occasion, as shown in FIG. 2A, the sectional areas of the exhaust flowpassages may be gradually enlarged, from the first-stage side toward the outermost side.

In stage systems to be used in semiconductor exposure apparatuses, performance of high-speed and high-precision motion is required. Therefore, the mass and weight of the movable member should be as small as possible. In consideration of this, generally, the sectional area of the stage movable member through which exhaust flowpassages are formed is very restricted. It is possible that, if the exhaust flowpassages are formed with the same section sectional area, the conductance of the outermost exhaust flow passage (third-stage flowpassage in this example) most remote from the static gas bearing surface is insufficient and a desired vacuum level is unattainable. In consideration of the above, one best exhaust method will be that, as shown in FIGS. 2A and 2B, the first-stage and second-stage exhaust flowpassages are formed with a required minimum sectional area, while the sectional area of the third-stage exhaust flowpassage is made large.

There are cases wherein, due to a structural restriction of the stage system, the exhaust flowpassage cannot be formed to extend directly from the inside of the movable member into the inside of the fixed member (stage base 2, vacuum chamber 1 wall, or the like). In such cases, it would be necessary to connect the movable member and the fixed member with each other by use of flexible pipe means, such as metal bellows, or a resin tube, for example. Hence, the movable member has to move while dragging the tube. Flexure or vibration of the tube would be an external disturbance which adversely influences the positioning precision of the stage system. In order to reduce the influence upon the positioning precision of the stage system as much as possible, the tube should be as flexible as possible and as fine as possible. However, if the tube is too narrow, the exhaust resistance becomes large and it disturbs collection of the gas discharged from the static gas bearing.

In consideration of the above, in order to satisfy both the stage positioning precision and the vacuum level at once, it would be an effective method to make the tubes for the first-stage and second-stage as narrow as possible, while making the third-stage tube wide to some degree.

Depending on the stage structure, rather than forming the exhaust flowpassage to extend through the movable member or fixed member, all the exhaust flowpassages may be provided by flexible tubes, such as metal bellows or resin tubes, connected to the vacuum chamber wall. In such a case, as well, it would be effective in the point of efficiency that the sectional area of the first-stage tube closest to the static gas bearing surface is made as narrow as possible, while the sectional area of the outermost tube is made wide.

Furthermore, depending on the structure there is a possibility that the fixed member has only a limited sectional area through which exhaust flowpassages are to be formed. In such a case as well, if the exhaust flowpassages are formed with the same sectional area, the conductance of the outermost exhaust flowpassage (third-stage flowpassage in this embodiment) most remote from the static gas bearing surface may be insufficient. In consideration of this, one best exhaust method will be that, as in the case of the movable member of FIG. 3, the first-stage and second-stage exhaust flowpassage are formed with a required minimum sectional area, while the sectional area of the third-stage exhaust flowpassage is made large.

Alternatively, those flowpassages from the first-stage flowpassage to one flowpassage just inside the outermost flowpassage, inclusive, may be formed with the same sectional area, while the sectional area of only the outermost flowpassage may be made large (see FIG. 2B).

Gases which leak from the static gas bearing to the inside of the vacuum chamber 1, as well as any outgases from the structure, or the like, are collected by the vacuum pump 4, such that a desired vacuum level can be maintained inside the chamber.

FIG. 3 illustrate an example of a vacuum static gas bearing, which is usable in the vacuum stage system of FIG. 1. There are three stages of exhaust grooves 22, 23 and 24, provided around the static gas bearing portion 21, for collecting gases discharged from the static gas bearing. Here, the exhaust groove 22 will be referred to as a first-stage groove, the exhaust groove 23 will be referred to as a second-stage groove, and the exhaust groove 24 will be referred to as a third-stage groove, respectively. These exhaust grooves are connected to respective exhaust flowpassages, extending through the structure of the stage system, via exhaust bores 25, 26 and 27, respectively.

In FIG. 3, the widths of the first-stage, second-stage and third-stage exhaust grooves are becoming larger in this order, and, in this connection, the size of the exhaust bores are becoming larger correspondingly. While this structure has good exhausting efficiency, the overall dimension of the vacuum static gas bearing system itself becomes large. Thus, if there is some restriction in size, the exhaust grooves 22, 23 and 24 may be formed with the same width, while the exhaust bores may be made oval.

Figure 4:
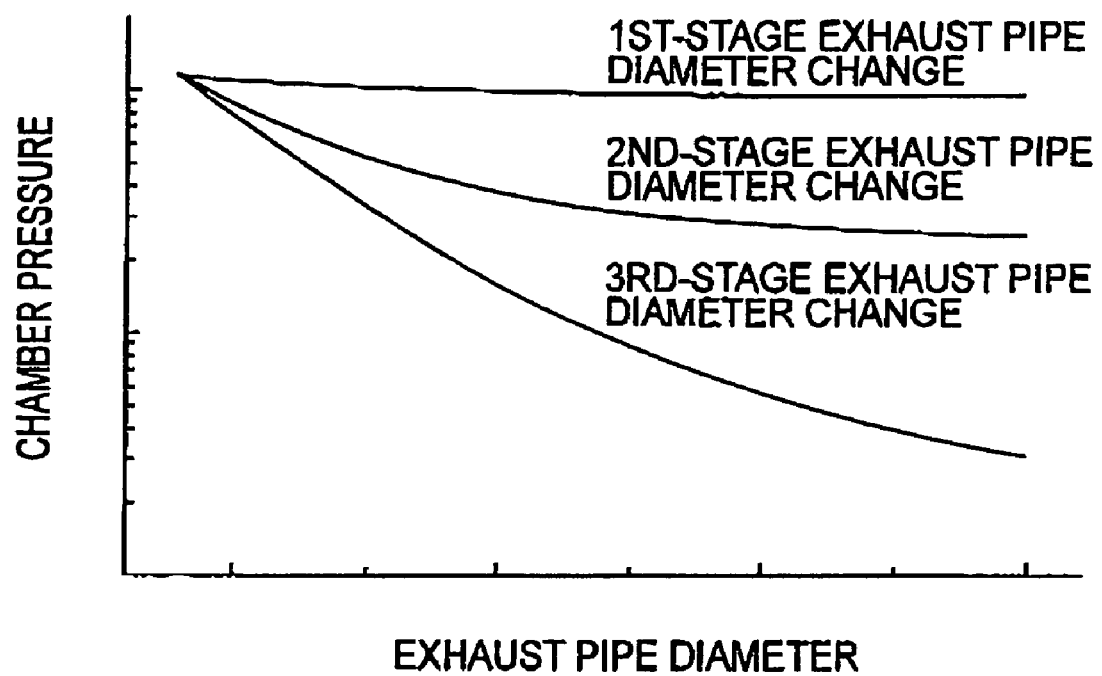
FIG. 4 is a graph for explaining influences of exhaust pipe diameter of each stage exhaust pipe.
Figure 5:
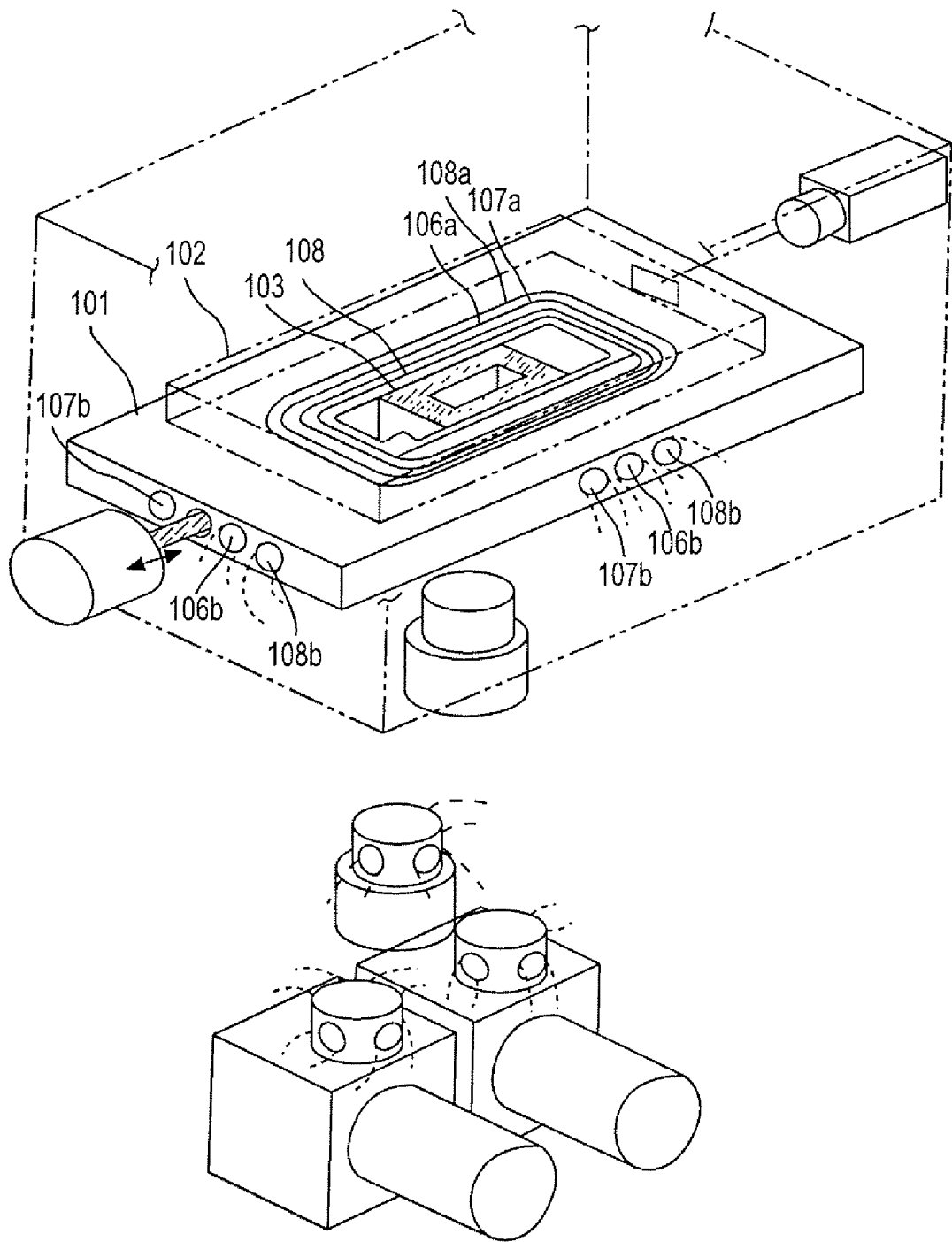
FIG. 5 is a schematic view of a known example of a vacuum stage system.

FIG. 4 illustrates the relationship between the diameter of the first-stage, second-stage and third-stage exhaust flowpassages and the chamber pressure, on an occasion wherein the exhaust flowpassages are circular tubes and the lengths of them are constant. Here, when the tube diameter of the first stage is changed, the tube diameters of the second and third stages are fixed. Similarly, when the tube diameter of the second stage is changed, the tube diameters of the first and third stages are fixed. When the tube diameter of the third stage is changed, the tube diameters of the first and second stages are fixed. It is seen from the drawing that the effect to decrease chamber pressure is not significant when the tube diameter of the first stage, closest to the bearing surface 21, is enlarged, a second smallest chamber pressure change is caused by changing the tube diameter of the second stage, and a largest chamber pressure reducing effect is obtainable by enlarging the tube diameter of the third-stage exhaust flowpassage. Hence, it is seen that, regarding the exhaust flowpassages extending through the stage structure and connected to the outside of the vacuum chamber, the third exhaust flowpassage should be made sufficiently wide, while making the first-stage and second-stage exhaust flowpassages with a certain diameter.

As regards enlargement of the conductance, it can be done not only by enlarging the sectional area of the exhaust flowpassage, but also by shortening the length of the exhaust flowpassage. Therefore, the exhaust flowpassages should desirably be made as short as possible.

Although the present embodiment has been described with reference to a vacuum stage system having exhaust grooves and exhaust flowpassages formed in a three-stage structure, the number of the exhaust grooves and exhaust flowpassages is not limited to three. A two-stage exhausting structure or a four-stage exhausting structure, for example, may be used as required.

In the embodiment of the present invention described above, air leaking from the static gas bearing into the vacuum chamber can be collected at high efficiency. Additionally, the cost of production can be reduced, and the possibility of an assembling error, such as a wrong connection, can be reduced. Furthermore, the overall dimension of the vacuum stage system can be made smaller, and thus, the cost of the stage system can be lowered.

Second Embodiment

Next, referring to FIGS. 6 and 7, an embodiment of a device manufacturing method, which uses an exposure apparatus having a vacuum stage device described above, will be explained.

Figure 6:
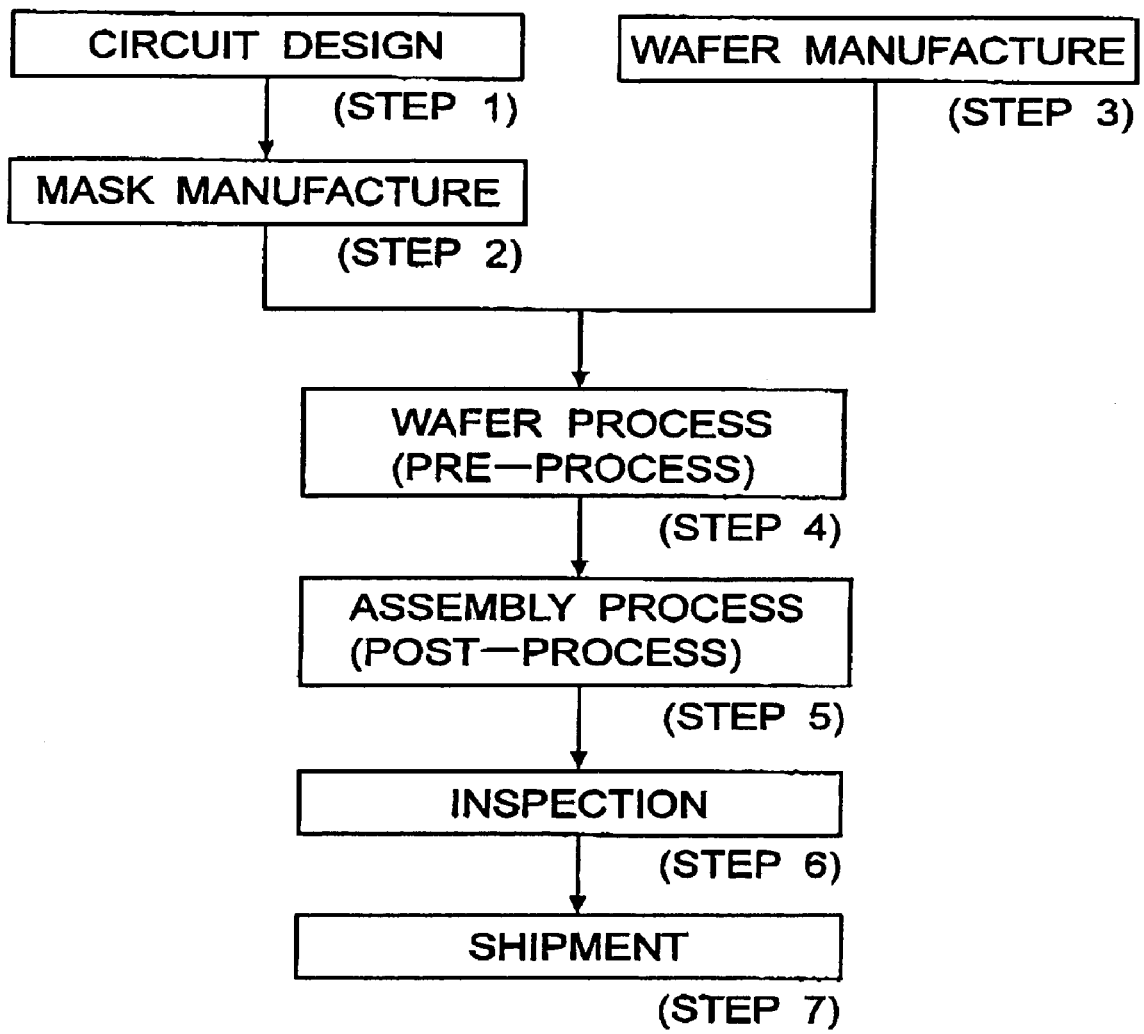
FIG. 6 is a flow chart for explaining the procedure of device manufacturing processes.

FIG. 6 is a flow chart for explaining the procedure of manufacturing various microdevices of manufacturing various microdevices, such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

Figure 7:
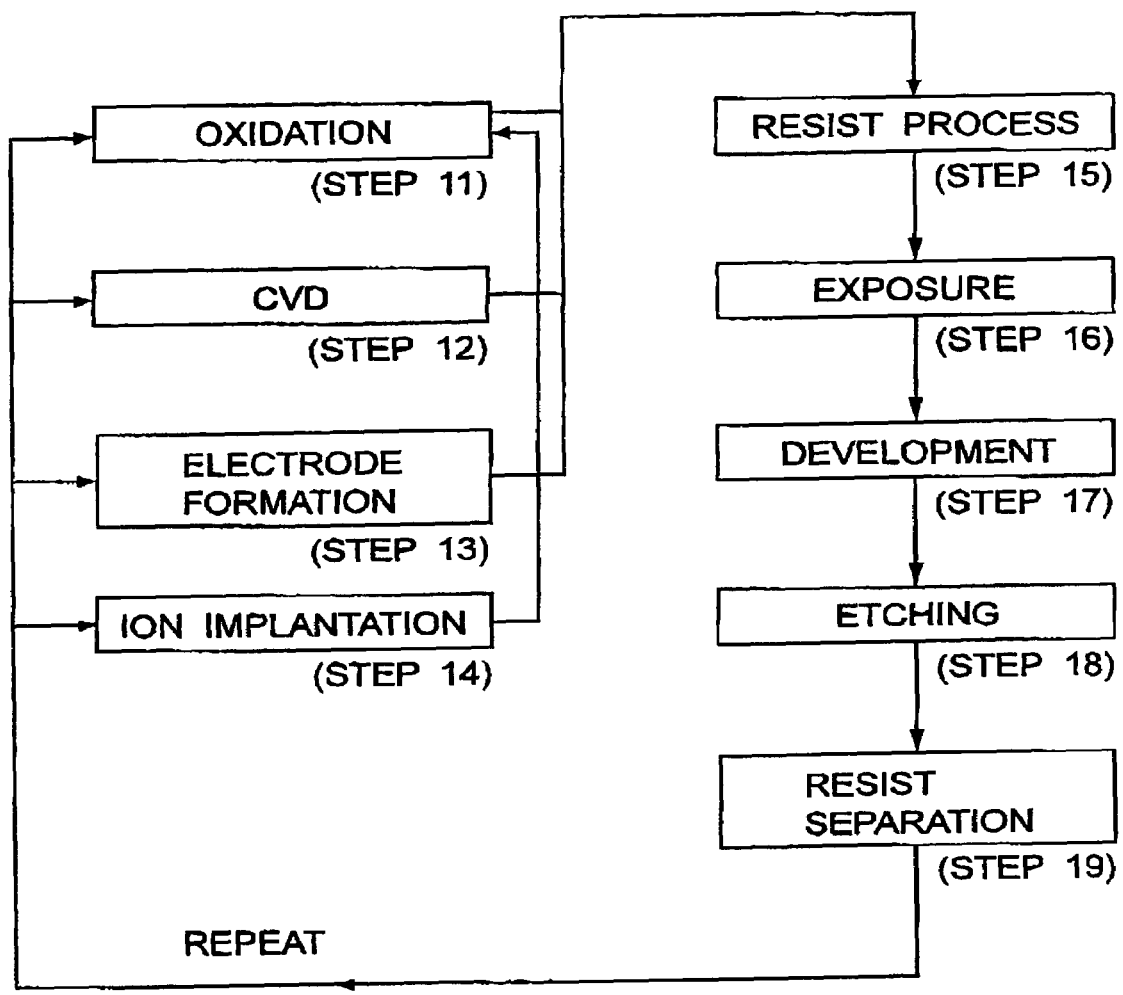
FIG. 7 is a flow chart for explaining details of a wafer process in the procedure of FIG. 6.

FIG. 7 is a flow chart for explaining details of the wafer process. Step 11 is an oxidation process for oxidizing the surface of a wafer. Step 12 is a CVD process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured with lower cost.

While the invention has been described with reference to the structure disclosed herein, it is not confined to the details set forth and this application is intended to cover such modifications or changes as may come within the purposes of the improvements or the scope of the following claims.

This application claims priority from Japanese Patent Application No. 2003-390444 filed Nov. 20, 2003, which is hereby incorporated by reference.

What is claimed is:

1. An apparatus comprising:
    a static gas bearing provided upon a first object and configured to form a gas layer between the first object and a second object by use of gas supplied thereto, and to support the first object movably relative to the second object;
    a plurality of exhaust grooves provided upon the first object and configured to surround said static gas bearing; and
    a plurality of exhaust flowpassages provided through the first object, connecting to a respective one of said plurality of exhaust grooves, and configured to exhaust gas from a respective one of said plurality of exhaust grooves,
    wherein an outermost exhaust flowpassage of said plurality of exhaust flowpassages connected to an outermost exhaust groove, which is an outermost one of said plurality of exhaust grooves with respect to said static gas bearing, is shorter than an innermost exhaust flowpassage of said plurality of exhaust flowpassages connected to an innermost exhaust groove, which is an innermost one of said plurality of exhaust grooves with respect to said static gas bearing, so that a conductance of said outermost exhaust flowpassage is greater than that of said innermost exhaust flowpassage.

2. An apparatus according to claim 1, wherein a sectional area of said outermost exhaust flowpassage is greater than that of said innermost exhaust flowpassage.

3. A stage apparatus to be disposed inside a vacuum chamber, said apparatus comprising:
    a fixed object;
    a movable object movable relative to said fixed object;
    a static gas bearing provided upon said movable object and configured to form a gas layer between said movable object and said fixed object by use of gas supplied thereto, and to support said movable object movably relative to said fixed object;
    a plurality of exhaust grooves provided upon said movable object and configured to surround said static gas bearing; and
    a plurality of exhaust flowpassages provided through said movable object, connecting to a respective one of said plurality of exhaust grooves, and configured to exhaust gas from respective said plurality of exhaust grooves to an outside of the vacuum chamber,
    wherein an outermost exhaust flowpassage of said plurality of exhaust flowpassages connected to an outermost exhaust groove, which is an outermost one of said plurality of exhaust grooves with respect to said static gas bearing, is shorter than an innermost exhaust flowpassage of said plurality of exhaust flowpassages connected to an innermost exhaust groove, which is an innermost one of said plurality of exhaust grooves with respect to said static gas bearing, so that a conductance of said outermost exhaust flowpassage is greater than that of said innermost exhaust flowpassage.

4. An apparatus according to claim 3, wherein a sectional area of said outermost exhaust flowpassage is greater than that of said innermost exhaust flowpassage.

5. An exposure apparatus for exposing a wafer to a pattern, said apparatus comprising:
    a stage apparatus as defined in claim 3 and configured to position a reticle for forming the pattern and the wafer.

6. A method of manufacturing a device, said method comprising steps of:
    exposing a wafer to a pattern by use of an exposure apparatus as defined in claim 5;
    developing the exposed substrate; and
    processing the developed substrate to manufacture the device.

* * * * *